United States Patent
Kondo

(10) Patent No.: US 9,885,756 B2
(45) Date of Patent: Feb. 6, 2018

(54) LOAD TESTING APPARATUS AND CAP FOR LOAD TESTING APPARATUS

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 0 days.

(21) Appl. No.: 15/657,574

(22) Filed: Jul. 24, 2017

(65) Prior Publication Data

US 2017/0322259 A1 Nov. 9, 2017

Related U.S. Application Data

(63) Continuation of application No. PCT/JP2016/055155, filed on Feb. 23, 2016.

(30) Foreign Application Priority Data

May 11, 2015 (JP) .................................. 2015-096151

(51) Int. Cl.
*H01C 10/14* (2006.01)
*G01R 31/34* (2006.01)
*G01R 31/28* (2006.01)

(52) U.S. Cl.
CPC ......... *G01R 31/34* (2013.01); *G01R 31/2879* (2013.01)

(58) Field of Classification Search
CPC ............................ G01R 31/34; G01R 31/2879
USPC ............................................. 324/537; 338/319
See application file for complete search history.

(56) References Cited

U.S. PATENT DOCUMENTS

| 6,653,928 B1* | 11/2003 | Kondo | ................... G01R 1/203 338/215 |
| 2014/0091762 A1* | 4/2014 | Kondo | ............... G01R 31/3631 320/109 |

FOREIGN PATENT DOCUMENTS

| JP | S62-162306 A | 7/1987 |
| JP | H11-007853 A | 1/1999 |
| JP | 2010-25752 A | 2/2010 |
| JP | 2015-040710 A | 3/2015 |
| WO | 2014-192042 A1 | 12/2014 |

OTHER PUBLICATIONS

International Search Report issued in PCT/JP2016/055155, dated May 31, 2016, with translation (5 pages).
Written Opinion of the International Searching Authority issued in PCT/JP2016/055155, dated May 31, 2016 (3 pages).

\* cited by examiner

*Primary Examiner* — Farhana Hoque
(74) *Attorney, Agent, or Firm* — Nakanishi IP Associates, LLC

(57) ABSTRACT

A load testing apparatus includes: a resistance unit including a plurality of resistors adapted to receive power supply from a test target power source and a wall adapted to hold both ends of each of the plurality of resistors; and a cover attached to a frame holding the resistance unit and adapted to protect the wall and a portion included in a terminal of the resistor and projecting and exposed from the wall. Each of the resistors includes a cap. The cap has an insulation property and is attached to the portion included in the terminal and projecting from the wall. The cover is made of a conductive material. The cap is arranged between the cover and the portion included in the terminal and projecting from the wall.

10 Claims, 16 Drawing Sheets

LOAD TESTING APPARATUS AND CAP FOR LOAD TESTING APPARATUS

CROSS-REFERENCE TO RELATED APPLICATIONS

This application is a continuation application of International Patent Application No. PCT/JP2016/055155 filed on Feb. 23, 2016, which claims priority to Japanese Patent Application No. JP2015/096151 filed on May 11, 2015, the entire contents of which are incorporated by reference.

TECHNICAL FIELD

The present invention relates to a load testing apparatus.

BACKGROUND ART

In the related art, there is a proposed dry load testing apparatus to perform a load test for a power generator as disclosed in Patent Literature 1.

CITATION LIST

Patent Literature

Patent Literature 1: JP 2010-25752 A

In a dry load testing apparatus, a plurality of resistors is held in a frame body, but a part of the resistor such as a terminal may project from the frame body.

A cover is needed to protect the portion projecting from the frame body, but there may be probability that short circuit may occur when the cover contacts the terminal.

SUMMARY OF THE INVENTION

One or more embodiments of the present invention are directed to a load testing apparatus or the like capable of protecting a portion projecting from a frame body of a resistor while preventing short circuit.

A load testing apparatus according to one or more embodiments of the present invention includes: a resistance unit including a plurality of resistors adapted to receive power supply from a test target power source and a wall adapted to hold both ends of each of the plurality of resistors; and a cover attached to a frame holding the resistance unit and adapted to protect the wall and a portion included in a terminal of the resistor and projecting and exposed from the wall. Each of the resistors includes a cap. The cap has an insulation property and is attached to the portion included in the terminal and projecting from the wall. The cover is made of a conductive material. The cap is arranged between the cover and the portion included in the terminal and projecting from the wall.

Since the terminal of the resistor is covered with the cap made of an insulation member, insulation can be kept between the terminal and the cover even when one side of the terminal comes close to the cover due to displacement of an installation position.

Since insulation can be kept even when the resistor is displaced, a conductive material like aluminum or iron can be used for the cover. The conductive material is unlikely to cause damages such as cracks compared with the case where the cover is made of a non-conductive material such as wood or plastic.

Consequently, short circuit between the resistor and the cover can be prevented, the portion included in (the terminal of) the resistor and projecting from the frame body (wall) can be protected, and a load test can be safely performed.

The cap may include: a cylindrical portion adapted to cover a side surface of the portion included in the terminal of the resistor and projecting from the wall; and a lid portion provided at one end portion of the cylindrical portion, and the cylindrical portion has a surface including folds.

The folds can prevent short circuit between the resistor and the cover caused by electrical connection to accumulated dust.

The cap may include: a cylindrical portion adapted to cover a side surface of the portion included in the terminal of the resistor and projecting from the wall; a lid portion provided at one end portion of the cylindrical portion; and a bar covering portion adapted to cover at least a side which is included in a short-circuit bar attached to the resistor and faces the cover.

Since the short-circuit bar and the terminal conductive with a resistance wire are covered with the cap made of the insulation member, it is possible to reduce probability that electrical short circuit occurs between the resistor and the cover due to dust accumulated around the short-circuit bar or the terminal.

The bar covering portion may have a main portion and a bar rear surface covering portion. The bar rear surface covering portion is bent from the main portion. A side of the short-circuit bar faces the wall and the bar rear surface covering portion covers the side of the short-circuit bar.

Even when dust is accumulated between the short-circuit bar and the wall, it is possible to reduce the probability that electrical short circuit occurs between the resistor and the cover.

Furthermore, the cap may include: a cylindrical portion adapted to cover a side surface of the portion included in the terminal of the resistor and projecting from the wall; and a lid portion provided at one end portion of the cylindrical portion, and an inner wall of the cylindrical portion has a height equal to a length of the portion included in the terminal of the resistor and projecting from the wall and also longer than a first distance representing a distance between a tip of the terminal of the resistor attached to the wall and the cover attached to the frame.

In the case where a second distance (inner wall height) is longer than the first distance, the cover can prevent the cap from being dropped even though the cap nearly comes off from the terminal due to vibration when the cap is attached to the terminal and the cover is attached to the frame.

Furthermore, it is possible to separate the cover from the terminal by a thickness of the lid portion, and displacement of the installation position of the resistor can be minimized.

The first distance may be 3 cm or more.

The load testing apparatus comes to be able to perform a load test for a three-phase AC power generator with a rated voltage of 400 V.

A cap used in a load testing apparatus according to one or more embodiments of the present invention has an insulation property and attached to a portion included in a terminal of a resistor and projecting from a wall in the load testing apparatus which includes: a resistance unit including a plurality of resistors adapted to receive power supply from a test target power source and the wall adapted to hold both ends of each of the plurality of resistors; and a cover attached to a frame holding the resistance unit, adapted to protect the wall and the portion included in the terminal of the resistor and projecting from the wall, and made of a conductive material, wherein the cap is arranged between the cover and the portion included in the terminal of the resistor and projecting and exposed from the wall.

The cap may include: a cylindrical portion adapted to cover a side surface of the portion included in the terminal of the resistor and projecting from the wall; and a lid portion provided at one end portion of the cylindrical portion, and the cylindrical portion has a surface including folds.

Also, the cap may include: a cylindrical portion adapted to cover a side surface of the portion included in the terminal of the resistor and projecting from the wall; a lid portion provided at one end portion of the cylindrical portion; and a bar covering portion adapted to cover at least a side which is included in a short-circuit bar attached to the resistor and faces the cover.

Also, the cap may include: a cylindrical portion adapted to cover a side surface of the portion included in the terminal of the resistor and projecting from the wall; and a lid portion provided at one end portion of the cylindrical portion, and an inner wall of the cylindrical portion has a height equal to a length of the portion included in the terminal of the resistor and projecting from the wall and also longer than a first distance representing a distance between a tip of the terminal of the resistor attached to the wall and the cover attached to the frame.

According to one or more embodiments of the present invention, a load testing apparatus or the like is capable of protecting a portion projecting from a frame body of a resistor while preventing short circuit.

DESCRIPTION OF EMBODIMENTS

Figure 1:
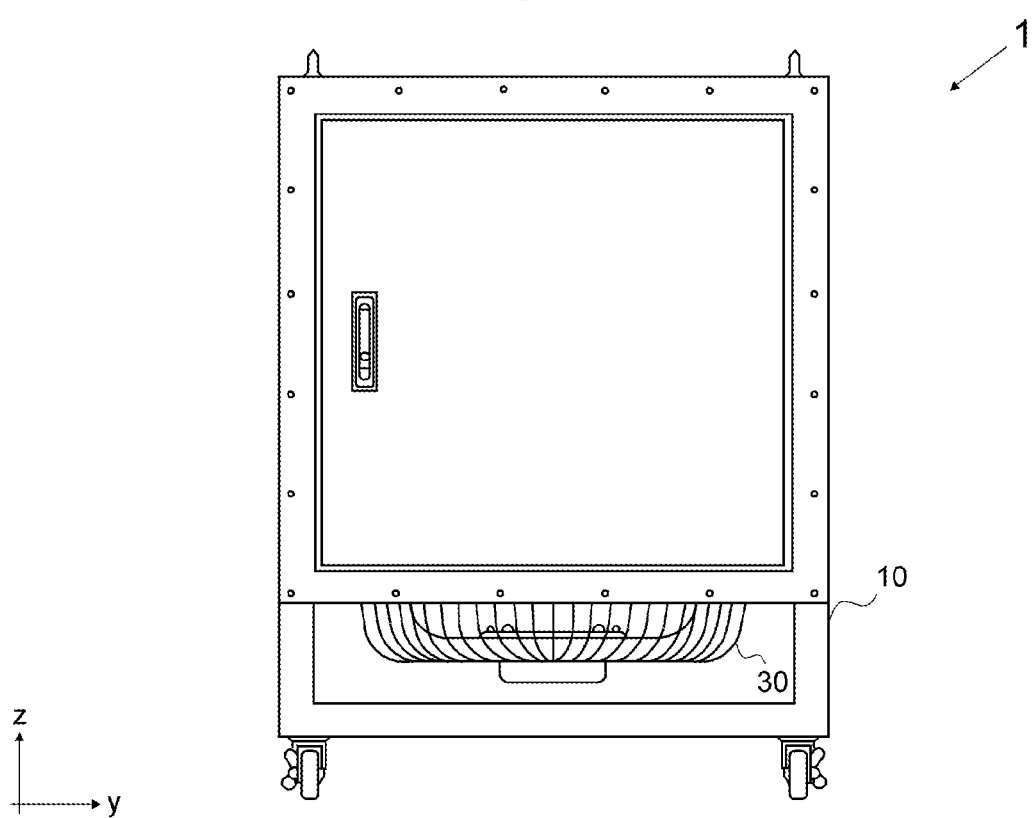
FIG. 1 is a front view of a load testing apparatus according to the present embodiment.

Hereinafter, the present embodiment will be described with reference to the drawings. A dry load testing apparatus 1 according to the present embodiment includes a frame 10, a resistance unit 20, a cooling unit 30, and a connection switching unit 40 (FIGS. 1 to 12).

Note that a horizontal direction in which the connection switching unit 40 and the frame 10 are arranged is defined as an x-direction, a horizontal direction perpendicular to the x-direction is defined as a y-direction, and a vertical direction perpendicular to the x-direction and the y-direction is defined as a z-direction for description of the directions.

Additionally, the cross-sectional structure views in FIGS. 7, 12, 13, and 16 illustrate not a cross-section but a state in a side surface view as for a resistance wire 61 and heat radiation fin 69 to easily understand the structures.

The frame 10 houses the resistance unit 20 in an upper stage and the cooling unit 30 in a lower stage. Additionally, the frame 10 has a side portion provided with the connection switching unit 40 and has a lower portion provided with a caster.

Figure 2:
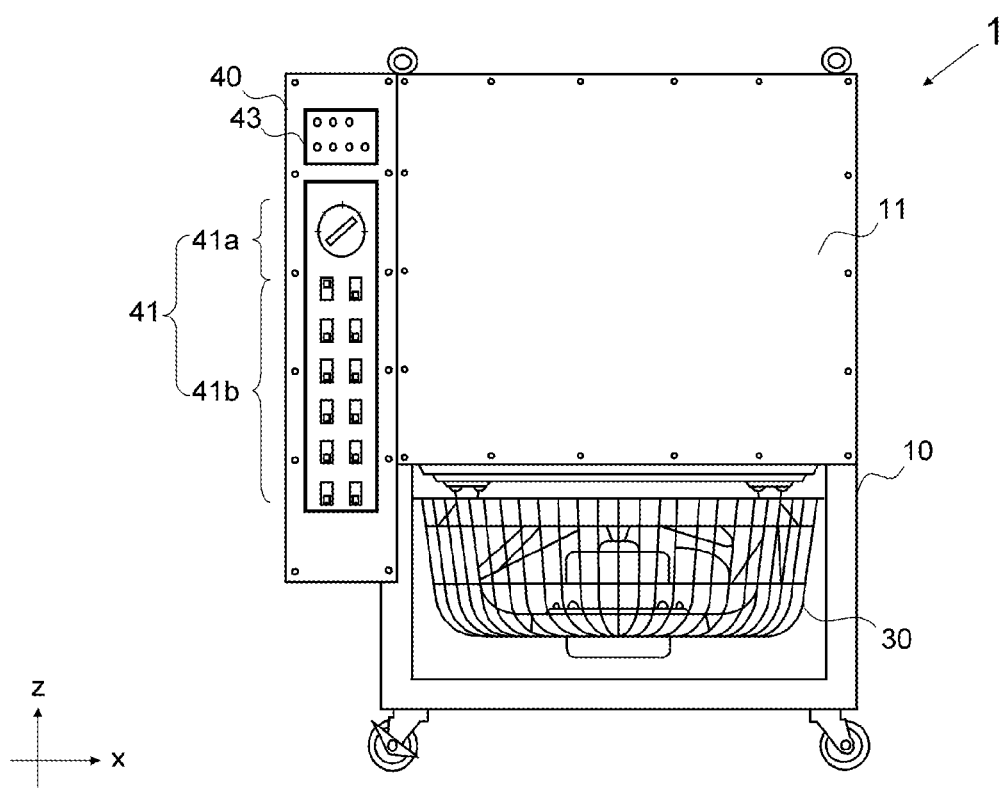
FIG. 2 is a side view of the load testing apparatus according to the present embodiment.

The frame 10 has a side surface (surface on which a terminal 63 of a resistor R constituting the resistance unit 20 is visible) provided with a cover 11 adapted to protect the terminal 63, a cable or a short-circuit bar connected to the terminal 63, and a casing 21 that holds the resistor R (see FIG. 2).

The cover 11 is made of a conductive material such as iron or aluminum.

The resistance unit 20 is obtained by arranging, in a plurality of stages in the z-direction, a resistor row in having a plurality of rod-shaped resistors R arranged in parallel to the y-direction at predetermined intervals in the x-direction, and used to perform, for example, a load test for a test target power source of a power generator or the like connected via a terminal connecting portion 43. The resistor R receives power supply from the test target power source.

In the present embodiment, the resistor rows each having nine resistors R arranged in the x-direction are arranged in thirteen stages in the z-direction. However, the number of resistors R arranged in each resistor row and the number of stages in which the resistor rows are stacked are not limited to the above.

Figure 4:
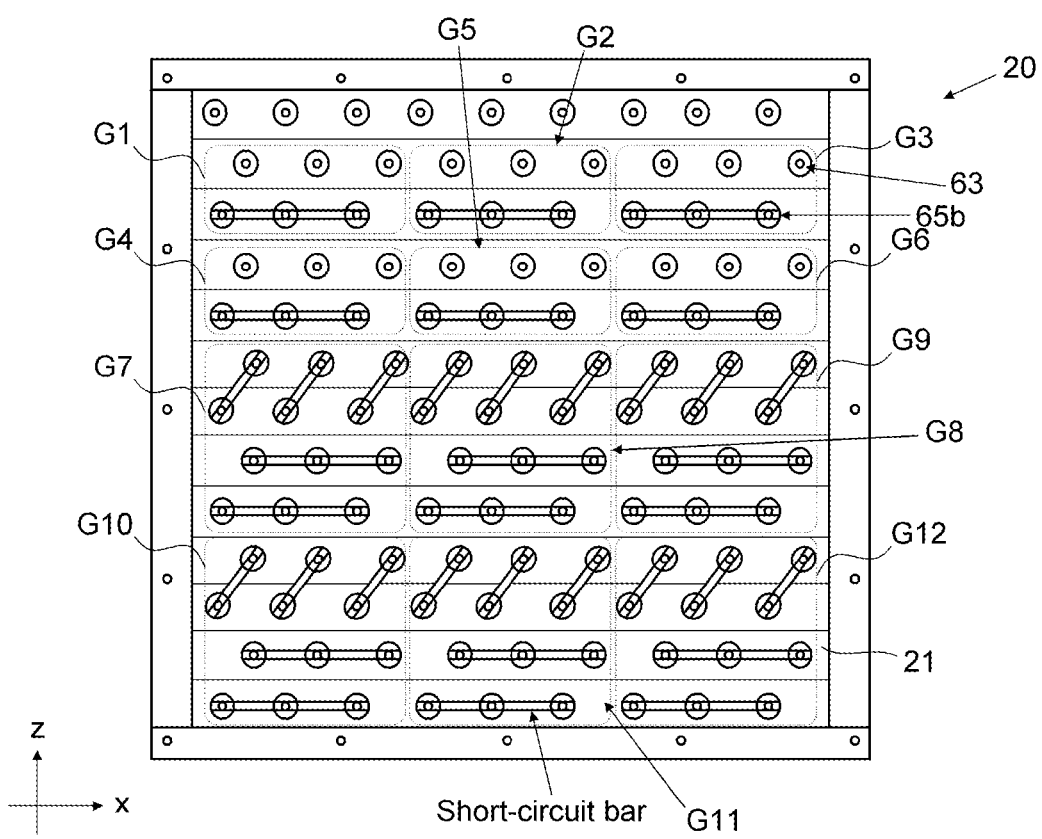
FIG. 4 is a view illustrating one side surface of a resistance unit before a cap is attached.
Figure 5:
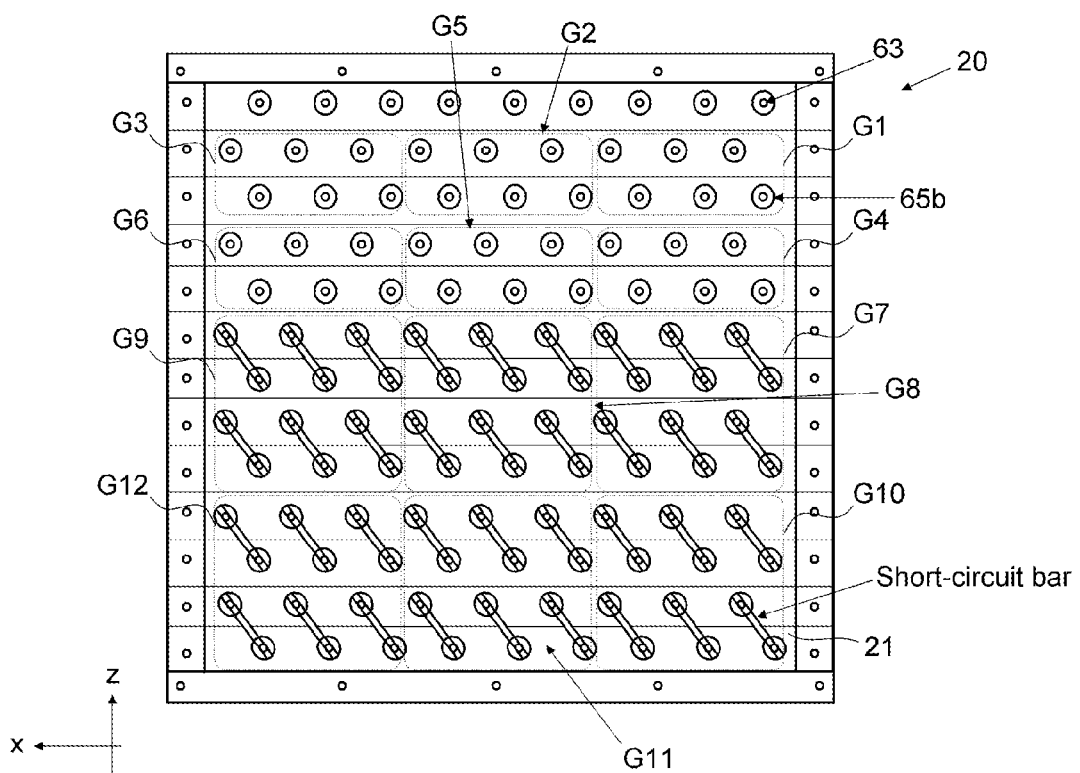
FIG. 5 is a view illustrating the other side surface of the resistance unit before the cap is attached.

Incidentally, it is desirable that at least resistors R in one resistor row of one stage (resistor row in an uppermost stage in the examples illustrated in FIGS. 4 and 5) be used as spare resistors for replacement or the like in the case of failure of another resistor R, and resistors R constituting resistor rows of other stages be used as resistors R constituting a first resistor group G1 to a twelfth resistor group G12.

Among the resistors R constituting the resistance unit 20, six or twelve resistors R adjacent to each other are set as one resistor group, and a load test is performed while changing the number of resistor groups to which voltage is applied from the test target power source.

Also, connection inside the resistor group (a connection state of the resistors R inside the resistor group) is changed in accordance with a type of power source subjected to a load test.

The resistance unit 20 includes the first resistor group G1 to the twelfth resistor group G12. In the present embodiment, described is an example including: the first resistor group G1 (rated capacity: 1 kW) including six resistors R having a rated voltage of 400 V and a rated capacity of 167 W; the second resistor group G2 (rated capacity: 2 kW, same in the third resistor group G3) including six resistors R having a rated voltage of 116 V and a rated capacity of 334 W; the fourth resistor group G4 (rated capacity: 5 kW) including six resistors R having a rated voltage 116 V and a rated capacity 834 W; the fifth resistor group G5 (rated capacity: 10 kW, same in the sixth resistor group G6) including six resistors R having a rated voltage 116 V and a rated capacity 1.67 kW; the seventh resistor group G7 (rated capacity: 20 kW, same in the eighth resistor group G8 to twelfth resistor group G12) including twelfth resistors R having a rated voltage 116 V and a rated capacity 1.67 kW. However, the number of resistor groups G, the respective rated voltages and rated capacities are not limited to the above-described structures.

The resistor R includes the resistance wire 61, the terminals 63 electrically connected to the resistance wire 61 and provided at both ends of the resistance wire 61, and a cylindrical portion 67 adapted to hold the terminals 63 via a first insulation member 65a and to cover the resistance wire 61 and a portion of a side surface of the terminal 63 (portion not exposed to outside from a wall constituting the casing 21) (refer to FIGS. 6, 7, 11, and 12).

The side surface of the cylindrical portion 67 is provided with the heat radiation fin 69.

The terminal 63 of the resistor R is connected to the terminal 63 of another resistor R with a short-circuit bar, and connected to the terminal connecting portion 43 and a relay via a cable.

The resistor R has a side surface covered with the casing 21 formed of four walls.

While having a positional relation in which a distance between a tip of the terminal 63 attached to the casing 21 and the cover 11 attached to the frame 10 is separated from each other by a first distance d1, a portion of the resistor R not conductive with the terminal 63 (such as vicinity of both ends of the cylindrical portion 67 holding the terminal 63 via the first insulation member 65a) is held at the wall constituting the casing 21 via a second insulation member 65b.

Figure 6:
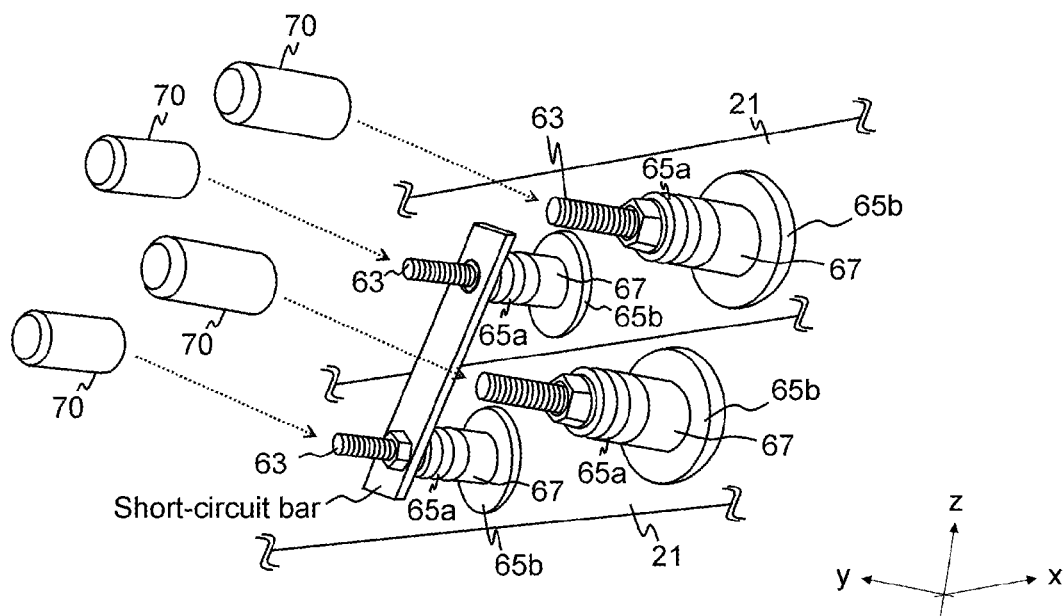
FIG. 6 is a perspective view illustrating a periphery of a terminal of a resistor before the cap is attached.
Figure 7:
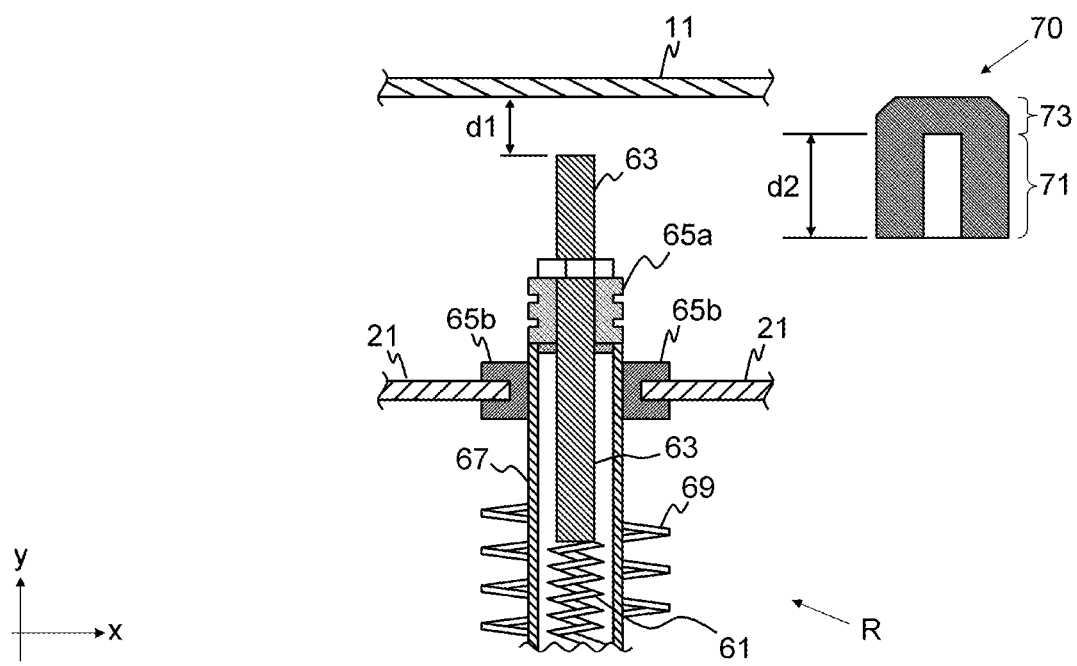
FIG. 7 is a cross-sectional structure view illustrating a positional relation between the resistor, a casing, and a cover before the cap is attached.
Figure 11:
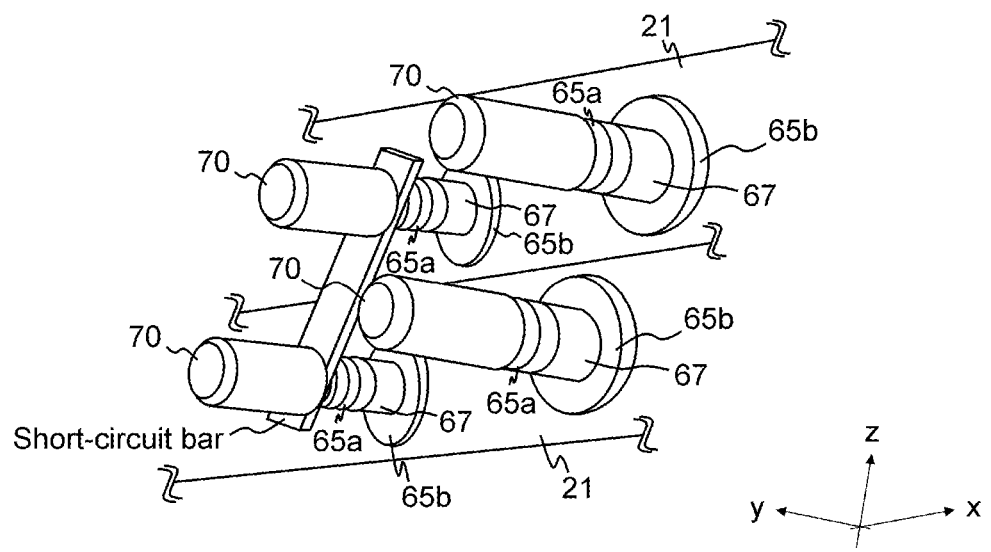
FIG. 11 is a perspective view illustrating the periphery of the terminal of the resistor after the cap is attached.
Figure 12:
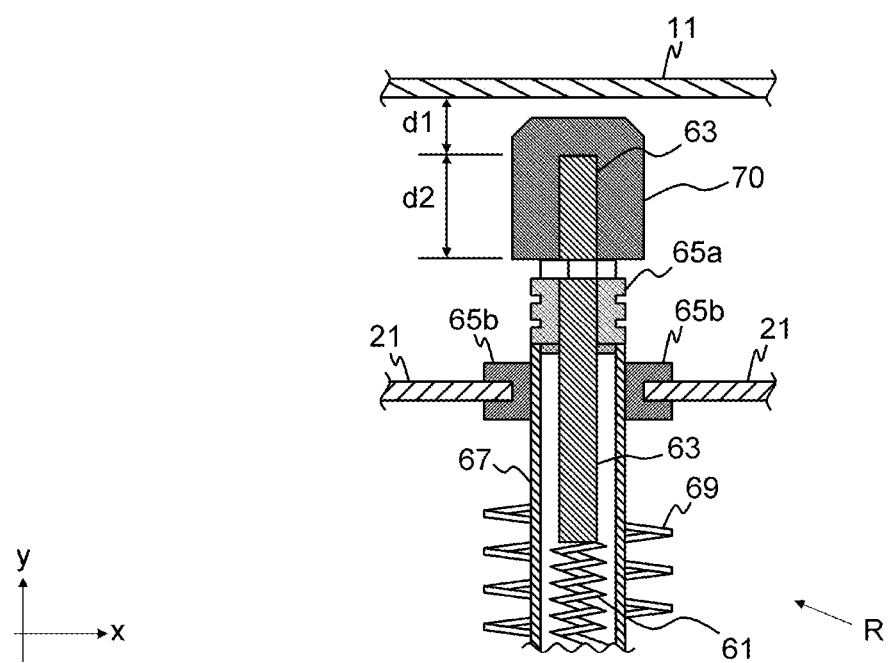
FIG. 12 is a cross-sectional structure view illustrating a positional relation between the resistor, casing, and cover after the cap is attached.

FIGS. 6 and 11 illustrate end portions of the four resistors R held at the casing 21 and two thereof have terminals 63 connected to each other via the short-circuit bar.

The first distance d1 is a length capable of providing insulation between the cover 11 and the terminal 63 by separation, and in the case where the load testing apparatus 1 is, for example, provided to perform a load test for a three-phase AC power generator having a rated voltage 400 V, a dimension of each of the components is determined such that the first distance d1 becomes 3 cm or more.

Additionally, the casing 21 has an upper surface and a lower surface opened so as to allow cold air from the cooling unit 30 provided at a lower portion flow to an upper portion.

A portion included in the terminal 63 of the resistor R and projecting and exposed from the wall constituting the casing 21 is covered with a cap (protective cover) 70 made of an insulation member such as rubber.

The cap 70 includes: a cylindrical portion 71 to cover a side surface of a portion included in the terminal 63 and projecting from the wall constituting the casing 21; and a lid portion 73 provided at one end portion of the cylindrical portion 71 and facing the tip of the terminal 63, and a height of an inner wall of the cylindrical portion 71 (a second distance d2) is equal to a length of the portion included in the terminal 63 and exposed from the wall constituting the casing 21.

Figure 13:
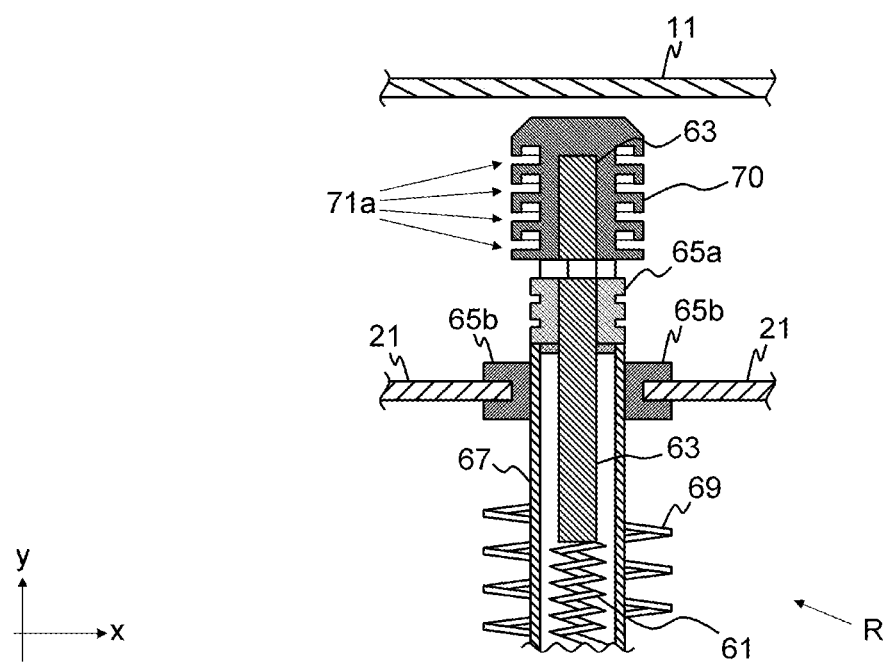
FIG. 13 is a cross-sectional structure view illustrating a positional relation between the resistor, casing, and cover after the cap including a cylindrical portion provided with folds is attached.

It is desirable that the surface (surface exposed to the outside) of the cylindrical portion 71 be formed in folds-like shapes (include folds 71a) so as to prevent short circuit (conductivity) between the resistor R and the cover 11 caused by electrical connection to accumulated dust (refer to FIG. 13).

To efficiently perform cooling by the cooling unit 30, resistors R in each resistor row are arrayed such that resistors R in a resistor row adjacent in the z-direction are arranged in a middle position between the resistors R constituting the resistor row and resistors R adjacent to the resistors R in the x-direction.

The cooling unit 30 having a cooling fan is provided at a lower portion of the resistance unit 20 (the lower stage of the frame 10).

Figure 3:
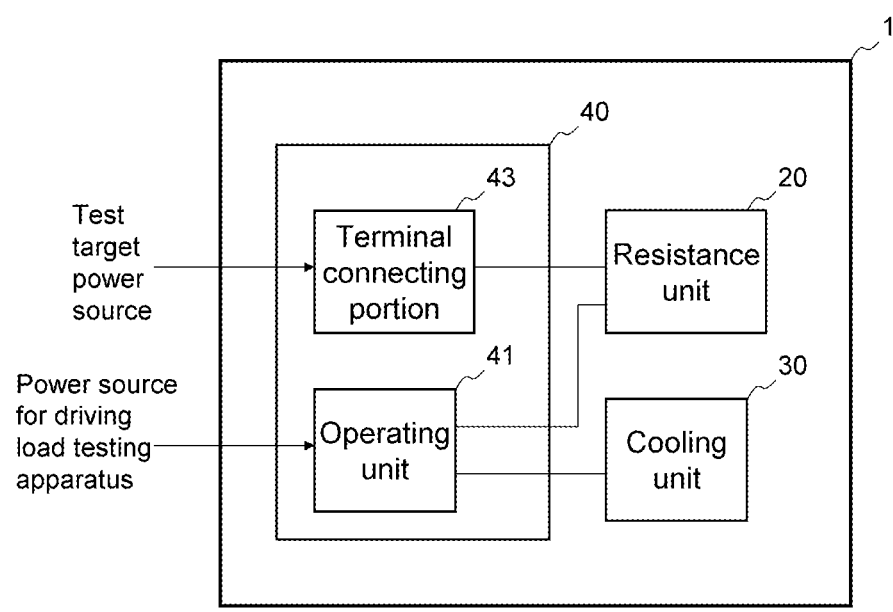
FIG. 3 is a schematic diagram illustrating a configuration of a load testing apparatus according to the present embodiment.

Each of the relays provided in the cooling unit 30 and provided in each of the resistor groups of the resistance unit 20 and adapted to control power supply to one or more of the resistor groups from the test target power source is driven by a power source different from the test target power source (a power source for driving the load testing apparatus) (refer to FIG. 3).

Figure 8:
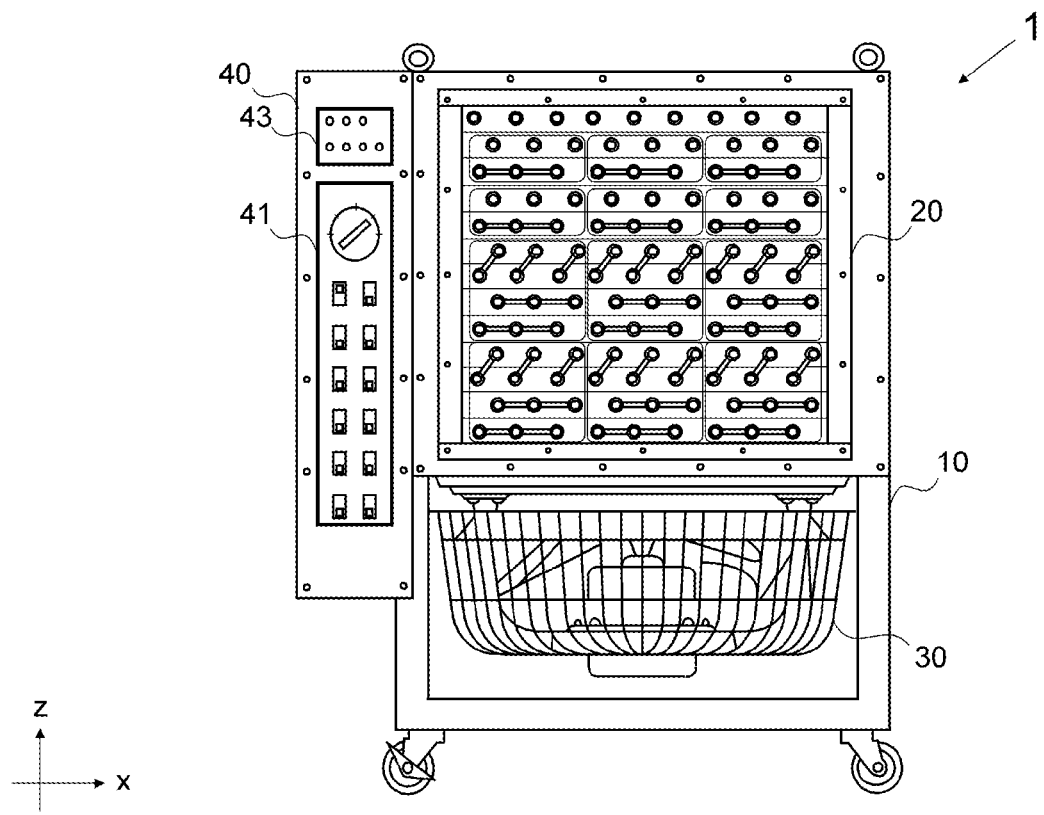
FIG. 8 is a side view of the load testing apparatus before the cover is attached.
Figure 9:
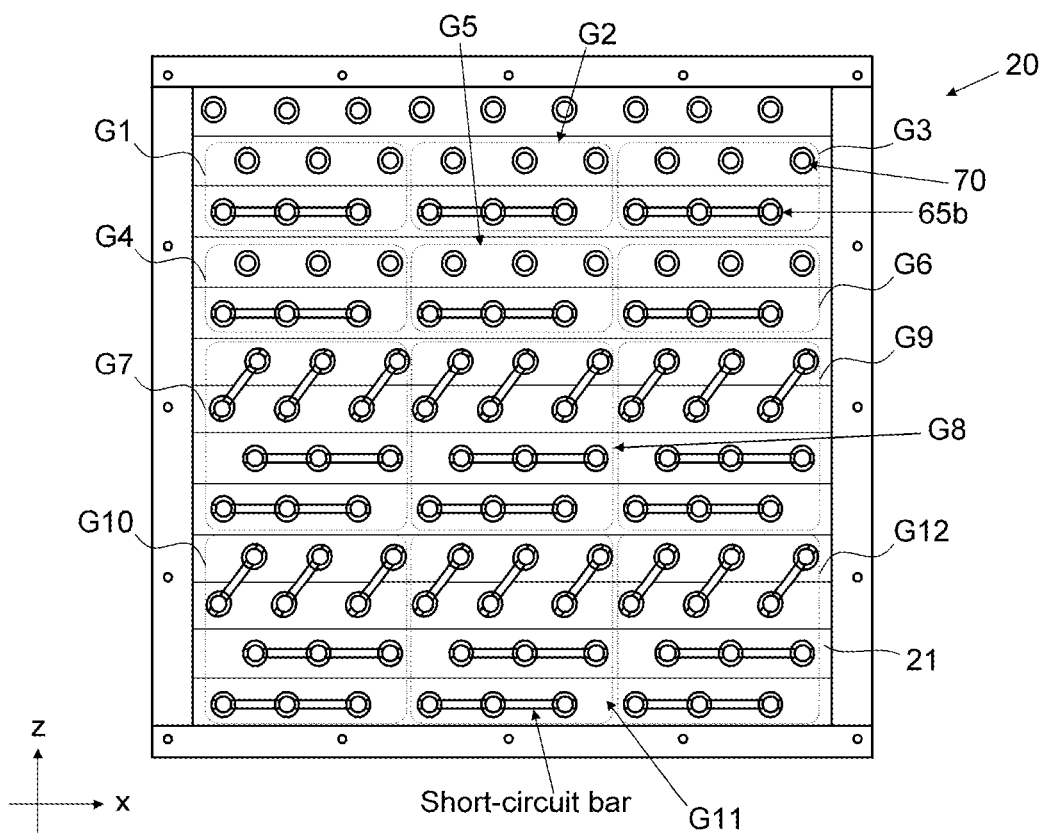
FIG. 9 is a view illustrating one side surface of the resistance unit after the cap is attached.
Figure 10:
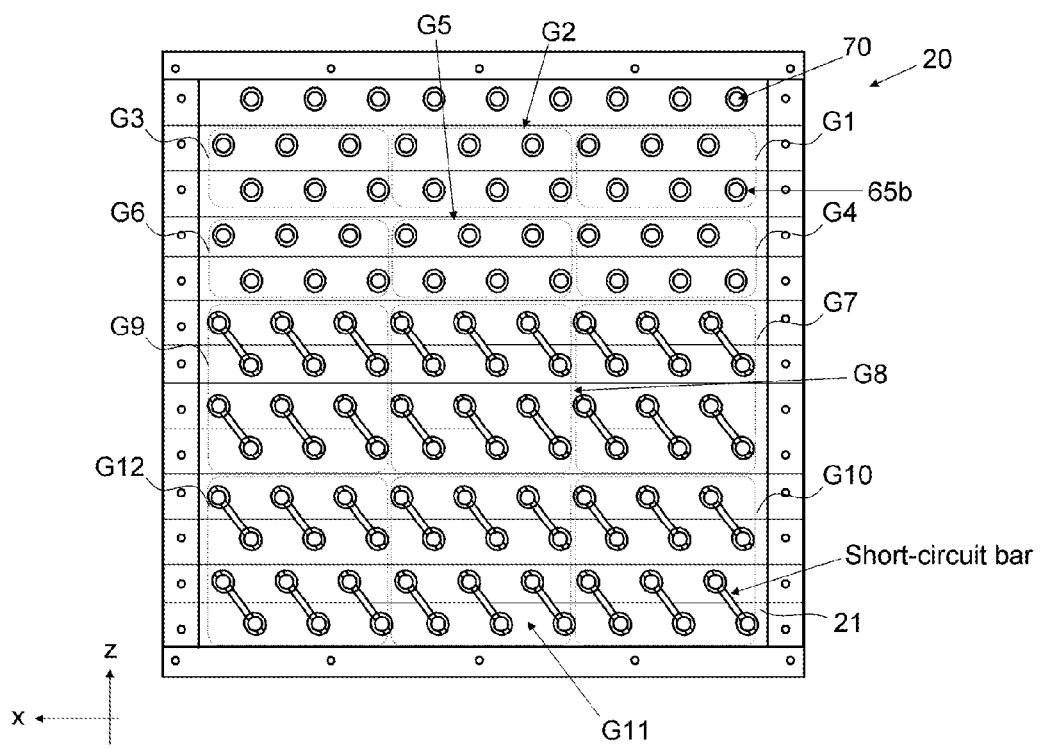
FIG. 10 is a view illustrating the other side surface of the resistance unit after the cap is attached.

The connection switching unit 40 includes an operating unit 41 and the terminal connecting portion 43 (refer to FIGS. 2, 3, and 8). The terminal connecting portion 43 may also be arranged at a position separated from the operating unit 41 (for example, a rear surface of the operating unit 41).

The operating unit 41 includes a mode changeover switch 41a and resistance changeover switches 41b.

The mode changeover switch 41a is a rotary type operation switch and used to turn on/off the load testing apparatus 1 and select a type of a test target power source (switch the mode).

The resistance changeover switches 41b are operation switches of slide type (or toggle type or push button type) and also are switches to perform on/off control for the relay in each of the first resistor group G1 to the twelfth resistor group G12. When the first operation switch S1 is turned on, the relay of the first resistor group G1 is made to an on state (conductive state) to obtain a state in which current can flow to the first resistor group G1 from the test target power source connected to the load testing apparatus 1 via the terminal connecting portion 43. In a similar manner, when the second operation switch S2 to the twelfth operation switch S12 are turned on, the relays of the corresponding resistor groups are made to the on state (conductive state) to obtain state in which current can flow to the resistor groups from the test target power source connected to the load testing apparatus 1 via the terminal connecting portion 43.

When a rotational position of the mode changeover switch 41a is set at a rotational position (operation mode) corresponding to a type of the test target power source, the cooling fan of the cooling unit 30 is driven, and on/off control for the relay in each of the first resistor group G1 to the twelfth resistor group G12 is performed based on an operation state of the resistance changeover switches 41b.

Incidentally, in the case where a main power switch is provided and the rotational position of the mode changeover switch 41a is set at a rotational position (operation mode) corresponding to the type of the test target power source while this main power switch is in the on state, driving of the cooling fan and on/off control for the relay in each of the first resistor group G1 to twelfth resistor group G12 may also be performed.

The terminal connecting portion 43 is a terminal to connect the test target power source, and the test target power source and the first resistor group G1 to twelfth resistor group G12 are made to a connectable state via the terminal connecting portion 43.

Since the terminal 63 is separated from the cover 11 by a distance of the first distance d1, insulation between the terminal 63 and the cover 11 may be kept even without coverage with the cap 70 as far as the first distance d1 has a sufficient length and the resistor R is held at a predetermined installation position of the wall constituting the casing 21.

However, it may be considered that the resistor R is displaced from the predetermined installation position due to vibration or the like, and one side of the terminal 63 comes close to the cover 11.

In the present embodiment, since the terminal 63 of the resistor R is covered with the cap 70 made of the insulation member, insulation between the terminal 63 and the cover 11 can be kept even when the one side of the terminals 63 comes close to the cover 11 due to displacement of the installation position.

Since insulation can be kept even when the resistor R is displaced, a conductive material like aluminum or iron can be used for the cover 11. The conductive material is unlikely to cause damages such as cracks compared with the case where the cover is made of a non-conductive material such as wood or plastic.

Consequently, short circuit between the resistor R and the cover 11 can be prevented, a portion included in (the terminal 63 of) the resistor R and projecting from a frame body (wall constituting the casing 21) can be protected, and a load test can be safely performed.

Furthermore, it is also desirable that dimensions of the respective components be set such that the second distance d2 becomes longer than the first distance d1.

In the case where the second distance d2 is longer than the first distance d1, the cover 11 prevents the cap 70 from being dropped even though the cap 70 nearly comes off from the terminal 63 due to vibration when the cap 70 is attached to the terminal 63 and the cover 11 is attached to the frame 10.

Furthermore, it is possible to separate the cover 11 from the terminal 63 by a thickness of the lid portion 73 (by a dimension in the y-direction), and displacement of an installation position of a resistor R can be minimized.

Figure 14:
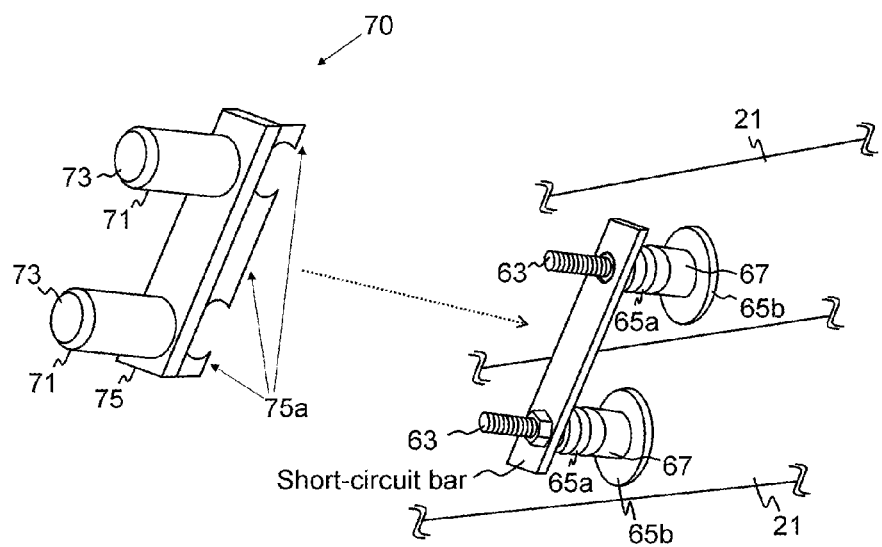
FIG. 14 is a perspective view illustrating the periphery of the terminal of the resistor before the cap including a bar covering portion is attached.
Figure 15:
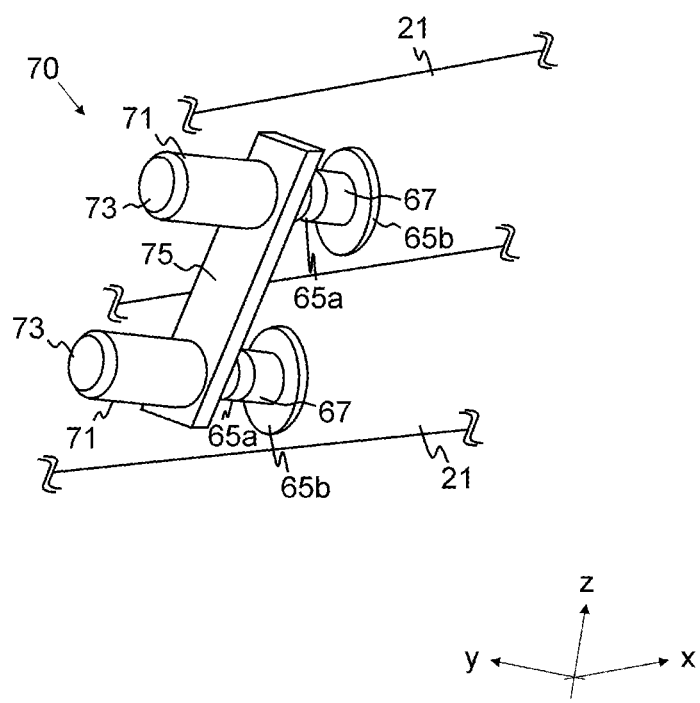
FIG. 15 is a perspective view illustrating the periphery of the terminal of the resistor after the cap including the bar covering portion is attached.
Figure 16:
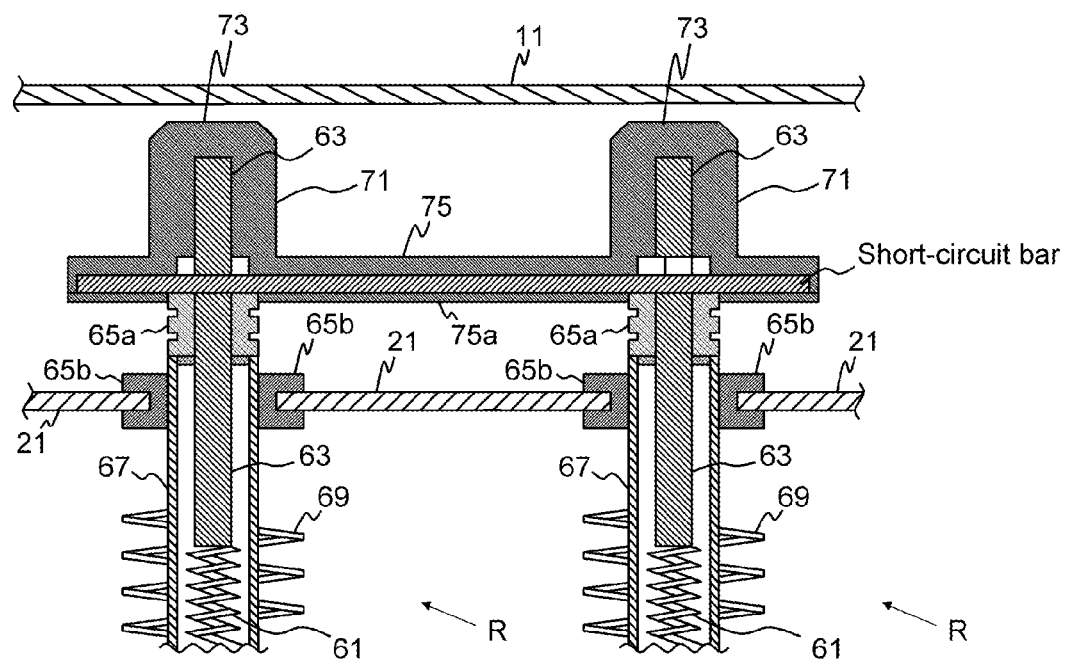
FIG. 16 is a cross-sectional structure view illustrating a positional relation between the resistor, casing, and cover after the cap including a bar rear surface covering portion is attached.

Additionally, in the present embodiment, the description has been provided assuming that only the terminal 63 is covered with the cap 70, but the short-circuit bar adapted to connect terminals 63 adjacent to each other may also be inclusively covered (refer to FIGS. 14 to 16).

For example, the cap 70 adapted to cover the short-circuit bar and the terminal 63 includes: a cylindrical portion 71 and the lid portion 73 to cover the terminal 63; and a bar covering portion 75 to cover the short-circuit bar.

In this case, a plurality of sets (two sets in FIGS. 14 to 16) of the cylindrical portion 71 and the lid portion 73 is provided for one cap 70 so as to cover the plurality of terminals 63 attached with the short-circuit bar.

Since the short-circuit bar and the terminals 63 conductive with the resistance wire 61 are covered with the cap 70 made of the insulation member, it is possible to reduce probability that dust is accumulated around the short-circuit bar and the terminal 63 and that short circuit occurs between the resistor R and the cover 11 (that the resistor R becomes conductive with and the cover 11).

It is desirable that the bar covering portion 75 has a bar rear surface covering portion 75a, which is bent from a portion (a main portion of the bar covering portion 75) covering a front surface of the short-circuit bar, adapted to cover a rear surface such that not only a front surface of the short-circuit bar (side facing the cover 11) but also the rear surface (side facing the wall constituting the casing 21) can be covered.

In this case, even when dust is accumulated between the short-circuit bar and the wall constituting the casing 21, it is possible to reduce probability that electrical short circuit occurs between the resistor R and the cover 11 (the resistor R becomes conductive with and the cover 11).

REFERENCE SIGNS LIST

1 Load testing apparatus
10 Frame
11 Cover
20 Resistance unit
21 Casing
30 Cooling unit
40 Connection switching unit
41 Operating unit
41a Mode changeover switch
41b Resistance changeover switches
43 Terminal connecting portion
61 Resistance wire
63 Terminal
65a, 65b First insulation member, second insulation member
67 Cylindrical portion
69 Heat radiation fin
70 Cap
71 Cylindrical portion
71a Fold
73 Lid portion
75 Bar covering portion
75a Bar rear surface covering portion
G1 to G12 First resistor group to twelfth resistor group
R Resistor

The invention claimed is:

1. A load testing apparatus comprising:
a resistance unit including a plurality of resistors configured to receive power supply from a test target power source and a wall configured to hold both ends of each of the plurality of resistors; and
a cover attached to a frame holding the resistance unit, wherein:
the cover is configured to protect the wall, and a portion included in a terminal of the resistor and projecting and exposed from the wall;
each of the resistors includes a cap;
the cap has an insulation property and is attached to the portion included in the terminal of the resistor and projecting from the wall, wherein
the cover is made of a conductive material,
the cap encloses a tip of the portion included in the terminal, and
the cap is arranged between the cover and the portion included in the terminal of the resistor and projecting from the wall.

2. The load testing apparatus according to claim 1, wherein the cap includes a cylindrical portion configured to cover a side surface of the portion included in the terminal of the resistor and projecting from the wall, and a lid portion provided at one end portion of the cylindrical portion, and the cylindrical portion has a surface including folds.

3. The load testing apparatus according to claim 1, wherein the cap includes a cylindrical portion configured to cover a side surface of the portion included in the terminal of the resistor and projecting from the wall, a lid portion provided at one end portion of the cylindrical portion, and a bar covering portion configured to cover at least a side which is included in a short-circuit bar attached to the resistor and faces the cover.

4. The load testing apparatus according to claim 3, wherein:

the bar covering portion comprises a main portion and a bar rear surface covering portion;

the bar rear surface covering portion is bent from the main portion;

a side of the short-circuit bar faces the wall; and the bar rear surface covering portion covers the side of the short-circuit bar.

5. The load testing apparatus according to claim 1, wherein the cap includes a cylindrical portion configured to cover a side surface of the portion included in the terminal of the resistor and projecting from the wall and a lid portion provided at one end portion of the cylindrical portion, and an inner wall of the cylindrical portion has a height equal to a length of the portion included in the terminal of the resistor and projecting from the wall and also longer than a first distance representing a distance between a tip of the terminal of the resistor attached to the wall and the cover attached to the frame.

6. The load testing apparatus according to claim 5, wherein the first distance is 3 cm or more.

7. A cap having an insulation property and attached to a portion included in a terminal of a resistor and projecting from a wall in a load testing apparatus including: a resistance unit including a plurality of resistors configured to receive power supply from a test target power source, and the wall configured to hold both ends of each of the plurality of resistors; and a cover attached to a frame holding the resistance unit, configured to protect the wall and the portion included in the terminal of the resistor and projecting from the wall, and made of a conductive material, wherein the cap is arranged between the cover and the portion included in the terminal of the resistor and projecting and exposed from the wall; and wherein the cap encloses a tip of the portion included in the terminal.

8. The cap according to claim 7, including a cylindrical portion configured to cover a side surface of the portion included in the terminal of the resistor and projecting from the wall, and a lid portion provided at one end portion of the cylindrical portion, wherein the cylindrical portion has a surface including folds.

9. The cap according to claim 7, including: a cylindrical portion configured to cover a side surface of the portion included in the terminal of the resistor and projecting from the wall; a lid portion provided at one end portion of the cylindrical portion; and a bar covering portion configured to cover at least a side which is included in a short-circuit bar attached to the resistor and faces the cover.

10. The cap according to claim 7, including a cylindrical portion configured to cover a side surface of the portion included in the terminal of the resistor and projecting from the wall, and a lid portion provided at one end portion of the cylindrical portion, wherein an inner wall of the cylindrical portion has a height equal to a length of the portion included in the terminal of the resistor and projecting from the wall and also longer than a first distance representing a distance between a tip of the terminal of the resistor attached to the wall and the cover attached to the frame.

* * * * *